(12) United States Patent
Lang et al.

(10) Patent No.: US 8,040,048 B2
(45) Date of Patent: Oct. 18, 2011

(54) PROCESS FOR FORMING AN ORGANIC ELECTRONIC DEVICE INCLUDING AN ORGANIC DEVICE LAYER

(76) Inventors: Charles D. Lang, Goleta, CA (US);
Dmitry Kolosov, Goleta, CA (US);
Johann Thomas Trujillo, Goleta, CA (US)

(*) Notice: Subject to any disclaimer, the term of this patent is extended or adjusted under 35 U.S.C. 154(b) by 488 days.

(21) Appl. No.: 12/332,519

(22) Filed: Dec. 11, 2008

(65) Prior Publication Data

US 2009/0155723 A1 Jun. 18, 2009

Related U.S. Application Data

(60) Provisional application No. 61/013,197, filed on Dec. 12, 2007.

(51) Int. Cl.
*H01J 1/62* (2006.01)
*B32B 9/00* (2006.01)
*G03F 7/00* (2006.01)

(52) U.S. Cl. .................. 313/504; 428/690; 430/311
(58) Field of Classification Search ............ 430/270.1, 430/311; 428/690
See application file for complete search history.

(56) References Cited

U.S. PATENT DOCUMENTS

| | | | |
|---|---|---|---|
| 6,303,238 B1 | 10/2001 | Thompson et al. | |
| 6,479,612 B1 | 11/2002 | DelPesco et al. | |
| 6,670,645 B2 | 12/2003 | Grushin et al. | |
| 7,138,551 B2 | 11/2006 | Shtarov et al. | |
| 7,151,342 B2* | 12/2006 | Sellars et al. | 313/509 |
| 7,554,112 B1* | 6/2009 | Lang et al. | 257/40 |
| 7,736,926 B2* | 6/2010 | Yagi | 438/47 |
| 2004/0062947 A1* | 4/2004 | Lamansky et al. | 428/690 |
| 2004/0102577 A1 | 5/2004 | Hsu et al. | |
| 2004/0127637 A1 | 7/2004 | Hsu et al. | |
| 2005/0184287 A1 | 8/2005 | Herron et al. | |
| 2005/0205860 A1 | 9/2005 | Hsu et al. | |
| 2006/0142520 A1* | 6/2006 | Jones et al. | 526/328.5 |
| 2007/0059555 A1* | 3/2007 | Iizumi et al. | 428/690 |
| 2007/0075626 A1* | 4/2007 | Yu et al. | 313/500 |
| 2007/0218582 A1* | 9/2007 | Lang et al. | 438/57 |
| 2008/0157659 A1* | 7/2008 | Prakash | 313/504 |
| 2008/0160270 A1* | 7/2008 | Prakash et al. | 428/212 |
| 2008/0233493 A1* | 9/2008 | Ishizeki et al. | 430/7 |
| 2008/0286487 A1* | 11/2008 | Lang et al. | 427/532 |
| 2009/0017268 A1* | 1/2009 | Skipor et al. | 428/195.1 |

FOREIGN PATENT DOCUMENTS

| | | |
|---|---|---|
| WO | 00/70655 | 11/2000 |
| WO | 01/41512 A1 | 6/2001 |
| WO | 03/008424 A1 | 1/2003 |
| WO | 03/040257 A1 | 5/2003 |
| WO | 03/063555 A1 | 7/2003 |
| WO | 03/091688 A2 | 11/2003 |
| WO | 2004/016710 A1 | 2/2004 |
| WO | 2005/052027 A1 | 6/2005 |

OTHER PUBLICATIONS

J Fluorine Chemistry 77 (1996) 193-194.
J Fluorine Chemistry 80 (1996) 135-144.
CRC Handbook of Chemistry and Physics, 81$^{st}$ Edition (2000-2001) (Book Not Included).

* cited by examiner

*Primary Examiner* — Amanda C. Walke

(57) ABSTRACT

A process of forming an electronic device is disclosed. An organic device layer is formed. The organic device layer includes a charge-selective material and a radiation sensitizer and has a first electrical conductivity and a first surface energy. First portions of the organic device layer are selectively exposed to radiation. The electrical conductivity and surface energy of the first portions of the organic device layer are modified.

12 Claims, 2 Drawing Sheets

PROCESS FOR FORMING AN ORGANIC ELECTRONIC DEVICE INCLUDING AN ORGANIC DEVICE LAYER

RELATED APPLICATION DATA

This application claims priority under 35 U.S.C. §119(e) from U.S. Provisional Application No. 61/013,197 filed on Dec. 12, 2007, which is incorporated by reference herein in its entirety.

BACKGROUND INFORMATION

1. Field of the Disclosure

This disclosure relates in general to processes for forming organic electronic devices.

2. Description of the Related Art

Electronic devices, including organic electronic devices, continue to be more extensively used in everyday life. Forming circuits in such electronic devices includes forming conductive pathways in organic layers such as those that lie between electrodes of the electronic device. One method to define the conductive pathway is to form a conductive structure by removing portions of a previously formed conductive layer. Another method is to print the conductive structure using a selective deposition technique. Insulating material can be deposited between such conductive structures to provide electrical insulation and planarization. When the insulating material is blanket deposited, openings are made in the insulating layer such that the conductive structures can be electrically connected to form conductive pathways. Another method is to form a well within bank structures such that a conductive liquid deposited over the bank structures collects in the wells to form conductive structures. However uniform formation and fill of many individual structures can be difficult to control.

Improved methods for defining conductive pathways are desired.

SUMMARY

There is provided a process for forming an electronic device that includes forming an organic device layer comprising a charge-selective material, a radiation sensitizer, and a photocurable surface-active composition, said layer having a first electrical conductivity and a first surface energy;
 selectively exposing portions of the organic device layer to radiation resulting in exposed areas and unexposed areas, and
 applying a development treatment,
wherein the electrical conductivity of the exposed areas of the organic device layer is less than the first electrical conductivity, and the surface energy of the exposed areas of the organic device layer is less than the first surface energy.

The foregoing general description and the following detailed description are exemplary and explanatory only and are not restrictive of the invention, as defined in the appended claims.

BRIEF DESCRIPTION OF THE DRAWINGS

Embodiments are illustrated in the accompanying figures to improve understanding of concepts as presented herein.

Figure 1:
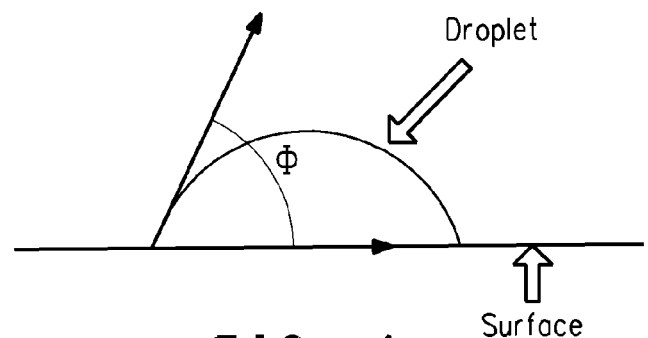
FIG. 1 includes a diagram illustrating contact angle.

Skilled artisans appreciate that objects in the figures are illustrated for simplicity and clarity and have not necessarily been drawn to scale. For example, the dimensions of some of the objects in the figures may be exaggerated relative to other objects to help to improve understanding of embodiments.

DETAILED DESCRIPTION

An electronic device can include an organic device layer. A process of forming an electronic device can include forming an organic device layer comprising a charge-selective material, a radiation sensitizer, and a photocurable surface-active composition, said layer having a first electrical conductivity and a first surface energy;
 selectively exposing portions of the organic device layer to radiation resulting in exposed areas and unexposed areas, and
 applying a development treatment,
wherein the electrical conductivity of the exposed areas of the organic device layer is less than the first electrical conductivity, and the surface energy of the exposed areas of the organic device layer is less than the first surface energy.

In one embodiment, forming the organic device layer can include forming a charge-selective film, and exposure and development are performed before forming another film on the charge-selective film. In another embodiment, the organic device layer is selectively exposed to a wavelength of radiation having a value not greater than 365 nm. In still another embodiment, selectively exposing the organic device layer to radiation can be performed at a peak intensity of at least 1 $J/cm^2$ at a surface within a first portion of the organic device layer.

In another embodiment, the charge-selective material is a large molecule material.

In another embodiment, the charge-selective material is a hole-transport material.

In another embodiment, the photocurable surface-active composition is a small molecule compound.

In a particular embodiment, selectively exposing the organic device layer to radiation, further includes placing a stencil mask between a radiation source and a charge-selective film of the organic device layer, and selectively exposing the charge-selective film such that substantially unattenuated radiation reaches a first portion of the charge-selective film and attenuated radiation is substantially prevented from reaching a second portion of the charge-selective film.

In a particular embodiment, applying a development treatment comprises heating to a temperature above the vaporization temperatures of both the radiation sensitizer and the photocurable surface-active composition in the unexposed areas. The heating temperature is below that where either of the materials reacts with the charge-selective material or produces undesirable degradation products.

Many aspects and embodiments have been described above and are merely exemplary and not limiting. After reading this specification, skilled artisans appreciate that other aspects and embodiments are possible without departing from the scope of the invention.

Other features and benefits of any one or more of the embodiments will be apparent from the following detailed description, and from the claims. The detailed description first addresses Definitions and Clarification of Terms followed by the Radiation Sensitizer, the Photocurable Surface-Active Composition, the Organic Device Layer, Fabrication of an Electronic Device, the Other Device Layers, and Examples.

1. Definitions and Clarification of Terms

Before addressing details of embodiments described below, some terms are defined or clarified.

The term "charge-blocking," when referring to a layer or material, is intended to mean such layer or material reduces the likelihood that a charge migrates into another layer or material.

The term "charge-injecting," when referring to a layer or materials intended to mean such layer or material promotes charge migration into an adjacent layer, material.

The term "charge-selective," is intended to mean charge-blocking, charge-injecting, charge-transport, or any combination thereof.

The term "charge-transport," or "charge-transporting" when referring to a layer or material is intended to mean such layer or material facilitates migration of such charge through the thickness of such layer or material with relative efficiency and small loss of charge. Although light-emitting materials may also have some charge transport properties, the term "charge transport layer, material, member, or structure" is not intended to include a layer, material, member, or structure whose primary function is light emission.

The term "chemical containment pattern" is intended to mean a pattern that contains or restrains the spread of a liquid material by surface energy effects rather than physical barrier structures. The term "contained" when referring to a layer, is intended to mean that the layer does not spread significantly beyond the area where it is deposited.

The term "electrical conductivity" is intended to indicate a measure of a material's ability to conduct an electric current. When an electrical potential difference is placed across a conductor, its movable charges flow, giving rise to an electric current.

The term "large molecule," when referring to a compound, is intended to mean a compound, which has repeating monomeric units. In one embodiment, a large molecule has a molecular weight greater than 2,000 g/mol.

The term "layer" is used interchangeably with the term "film" and refers to a coating covering a desired area. The term is not limited by size. The area can be as large as an entire device or as small as a specific functional area such as the actual visual display, or as small as a single sub-pixel.

The term "modifying" and its variants is intended to mean a process under which a layer, material, or any combination thereof, is exposed to radiation and undergoes an irreversible change without introducing any additional material into such layer, material, or any combination thereof during the process.

The term "organic active film" is intended to mean an organic film, by itself, or when in contact with a dissimilar material capable of forming a rectifying junction.

The term "organic device layer" is intended to mean a layer that lies between electrodes within an electronic component and includes a charge-selective film, an organic active film, or any combination thereof.

As used herein, the term "over" does not necessarily mean that a layer, member, or structure is immediately next to or in contact with another layer, member, or structure. There may be additional, intervening layers, members or structures.

The term "photocurable surface-active composition" is intended to mean a composition that comprises at least one photocurable material, and when the composition is applied over or as a part of a layer, the surface energy of that layer is reduced. The term is abbreviated "PCSA", and refers to the composition both before and after exposure to radiation.

The term "photocured surface-active composition" refers to the photocurable surface-active composition after it has been formed into a layer and exposed to radiation.

The term "polyacid" is intended to mean an organic compound having two or more acid groups.

The term "radiation-sensitive" when referring to a material, is intended to mean that exposure to radiation results in a change of at least one chemical, physical, or electrical property of the material.

The term "radiation" is intended to mean energy in the form of waves or particles. Radiation may be within the visible-light spectrum, outside the visible-light spectrum (UV or IR). Radiation can also include radioactivity or another particle emission, such as an electron or other particle beam.

The term "radiation-emitting component" is intended to mean an electronic component, which when properly biased, emits radiation at a targeted wavelength or spectrum of wavelengths. The radiation may be within the visible-light spectrum or outside the visible-light spectrum (ultraviolet ("UV") or infrared ("IR")). A light-emitting diode is an example of a radiation-emitting component.

The term "radiation-responsive component" is intended to mean an electronic component, which when properly biased, can respond to radiation at a targeted wavelength or spectrum of wavelengths. The radiation may be within the visible-light spectrum or outside the visible-light spectrum (UV or IR). An IR sensor and a photovoltaic cell are examples of radiation-sensing components.

The term "radiation sensitizer" is intended to mean a compound or system of compounds which can absorb radiation and produce chemical changes in a material. In some embodiments, the radiation sensitizer absorbs radiation to form an excited state. The excited state transfers the energy to a second molecule to form an excited state in that second molecule. In some embodiments, the radiation sensitizer generates free radicals when exposed to radiation.

The term "resistivity" is the inverse of electrical conductivity. Resistivity is a measure of how strongly a material opposes the flow of electric current. A low resistivity indicates a material that readily allows the movement of electrical charge.

The term "small molecule," when referring to a compound, is intended to mean a compound which does not have repeating monomeric units. In one embodiment, a small molecule has a molecular weight no greater than 2000 g/mol.

The term "surface energy" is the energy required to create a unit area of a surface from a material. A characteristic of surface energy is that liquid materials with a given surface energy will not wet surfaces with a sufficiently lower surface energy.

The term "ultra-violet" ("UV") is intended to mean radiation that has an emission maximum at a wavelength less than approximately 360 nm. As used herein, x-rays are an example of ultra-violet radiation.

The term "unsaturated" as it refers to an organic compound, is intended to mean that the compound has at least one carbon-carbon double bond or carbon-carbon triple bond.

The term "α,β-unsaturated" is intended to mean that the double or triple bond is in conjugation with an acid functional group.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

Also, use of "a" or "an" are employed to describe elements and components described herein. This is done merely for convenience and to give a general sense of the scope of the invention. This description should be read to include one or at least one and the singular also includes the plural unless it is obvious that it is meant otherwise.

Group numbers corresponding to columns within the Periodic Table of the elements use the "New Notation" convention as seen in the *CRC Handbook of Chemistry and Physics*, 81$^{st}$ Edition (2000-2001).

Unless otherwise defined, all technical and scientific terms used herein have the same meaning as commonly understood by one of ordinary skill in the art to which this invention belongs. Although methods and materials similar or equivalent to those described herein can be used in the practice or testing of embodiments of the present invention, suitable methods and materials are described below. All publications, patent applications, patents, and other references mentioned herein are incorporated by reference in their entirety, unless a particular passage is cited. In case of conflict, the present specification, including definitions, will control. In addition, the materials, methods, and examples are illustrative only and not intended to be limiting.

To the extent not described herein, many details regarding specific materials, processing acts, and circuits are conventional and may be found in textbooks and other sources within the organic light-emitting diode display, photodetector, photovoltaic, and semiconductive member arts.

2. The Radiation Sensitizer

In the process described herein, an organic device layer is formed, selectively exposed to radiation, and developed. The radiation sensitizer is a compound or system of compounds that absorbs the radiation used in the process. The absorption of the radiation by the radiation sensitizer results in chemical changes in the organic device layer. Because of the chemical changes, the electrical conductivity of the organic device layer is decreased. In some embodiments, the exposure step is carried out in air.

Any known radiation sensitive material which will effect a change in the organic device layer can be used as the radiation sensitizer. However, the sensitizer should be sensitive to the same type of radiation as the photocurable surface-active composition, as discussed below. The sensitizer may be a single compound or a system of two or more compounds.

In some embodiments, the radiation sensitizer is a free radical generator. Such materials are well known in the art of photoresists and other photosensitive materials. Examples of these radiation sensitizers include, but are not limited to, compounds which undergo fragmentation, systems of compounds which generate radicals by hydrogen abstraction, and photoreducible dyes, such as acridinium, xanthene and thiazine dyes. Examples of radiation-sensitive materials which generate free radicals include, but are not limited to, quinones, benzophenones, benzoin ethers, aryl ketones, peroxides, biimidazoles, benzyl dimethyl ketal, hydroxyl alkyl phenyl acetophone, dialkoxy actophenone, trimethylbenzoyl phosphine oxide derivatives, aminoketones, benzoyl cyclohexanol, methyl thio phenyl morpholino ketones, morpholino phenyl amino ketones, alpha halogennoacetophenones, oxysulfonyl ketones, sulfonyl ketones, oxysulfonyl ketones, sulfonyl ketones, benzoyl oxime esters, thioxanthrones, camphorquinones, ketocoumarins, and Michler's ketone.

In some embodiments, the radiation sensitizer can be applied with the charge-selective material by a liquid deposition technique to form the organic device layer. In some embodiments, the radiation sensitizer is a small molecule which is volatile at temperatures between 50° C. and 200° C.

3. Photocurable Surface-Active Composition

The organic device layer further comprises a photocurable surface-active composition ("PCSA"). The PCSA is a radiation-sensitive composition. When exposed to radiation, the PCSA reacts to form a material that is better adhered to a surface or more difficult to remove from a surface than the material not exposed to radiation. The addition of the PCSA lowers the surface energy of the organic device layer.

The radiation can be any type of radiation to which results in the desired physical change in the PCSA. However, the PCSA should be sensitive to the same radiation as the radiation sensitizer, as discussed above. In one embodiment, the radiation is selected from infrared radiation, visible radiation, ultraviolet radiation, and combinations thereof. In one embodiment, the radiation is deep UV radiation, having a wavelength in the range of 200-300 nm. In another embodiment, the ultraviolet radiation is of somewhat longer wavelength, in the range 300-400 nm.

The PCSA is applied from a liquid composition with the charge-selective material and the radiation sensitizer to form the organic device layer. In some embodiments, the PCSA has a vapor pressure which is sufficiently low to prevent unwanted evaporation after the layer is formed. In some embodiments, the PCSA does not react in the absence of radiation to form undevelopable species.

In some embodiments, the PCSA is a small molecule material. In some embodiments, the PCSA is volatile at a temperature between 50° and 200° C.

In some embodiments, the PCSA comprises a fluorinated ester or imide of an α,β-unsaturated polyacid. The acid groups can be selected from the group consisting of carboxylic acid, sulfonic acid, phosphoric acid, and combinations thereof. In some embodiments, the polyacid is a polycarboxylic acid.

In some embodiments, the polyacid is linear. In some embodiments, the polyacid is branched. In some embodiments, the polyacid may contain more than one unsaturated unit. In some embodiments, the polyacid is substituted. In some embodiments, this substitution incorporates one or more oxygen atoms into the hydrocarbon backbone of the unsaturated polyacid. In some embodiments, this substitution is pendant to the hydrocarbon backbone of the unsaturated polyacid. In some embodiments, this substitution contains fluorine atoms. In some embodiments, all of the acid groups are in conjugation with the unsaturated group or groups. In some embodiments, only one of the acid groups is in conjugation with an unsaturated group.

In some embodiments, the PCSA is at least 50% fluorinated, by which is meant that 50% of the available hydrogens bonded to carbon have been replaced by fluorine. In some embodiments, the PCSA is at least 60% fluorinated; in some embodiments, at least 70% fluorinated. In some embodiments, the PCSA is an ester or imide of an α,β-unsaturated, polyacid which is not aromatic. Examples of non-aromatic α,β-unsaturated polyacids include, but are not limited to, fumaric, maleic, itaconic, 2,2-dimethyl-4-methylenepentanedioic acid, muconic, 2-methyleneglutaric, and acotinic acids and oligomers of methacrylic acid. The PCSA may comprise one or more fluorinated esters or imides of unsaturated polyacids or fluorinated esters or imides of unsaturated polyacids in combination with fluorinated unsaturated monoacids.

In some embodiments, the ester is formed using a fluorinated alcohol, $R_fOH$. The $R_f$ group has 4-15 carbon atoms, 0-5 oxo oxygen atoms contained within the carbon atom chain, and at least 4 fluorine atoms, with the proviso that there is no fluorine atom on the carbon atom bearing OH. The fluorinated alcohol may be linear or branched, saturated or unsaturated. In some embodiments the alcohol has one of the formulas below:

$$HO-(CR^1R^2)-(CH_2)_s-\{(CR_aF_{2-a}O_b)_t-(CR=CRO_b)_w\}-CH_cF_{3-c}$$

or $$HO-(CR^1R^2)-CH[(CH_2)_s-\{(CR_aF_{2-a}O_b)_t-(CR=CRO_b)_w\}-CH_cF_{3-c}]_2$$

where a, b, c, p, s, t, and w are the same or different at each occurrence and are integers, and
 a=0-2,
 b=0-1,
 c=0-3,
 R=H or $(CH_aF_{2-a})_pF$,
 $R^1$, $R^2$=H or $C_pH_{2p+1}$,
 p=1-3,
 s=0-5,
 t=2-15, and
 w=0-2.

The groups within the brackets { } can be arranged in any order. In some embodiments, $1 \leq s \leq 4$. In some embodiments, s=2 or 3. In some embodiments, $4 \leq t+w \leq 12$. In some embodiments, c=0. In some embodiments, w=0 or 1. In some embodiments, a=0. In some embodiments, R=H or $CF_3$. In some embodiments, $R^1=R^2=H$. In some embodiments, $R^1=R^2=CH_3$.

Some non-limiting examples of fluorinated alcohols include:

[chemical structures]

In some embodiments, the amide is formed using a fluorinated amine, $R_fNH_2$. The $R_f$ group has 4-15 carbon atoms, 0-5 oxo oxygen atoms contained within the carbon atom chain, and at least 4 fluorine atoms, with the proviso that there is no fluorine atom on the carbon atom bearing $NH_2$. The fluorinated amine may be linear or branched, saturated or unsaturated. In some embodiments the amine has one of the formulas below:

$$H_2N-(CR^1R^2)-(CH_2)_s-\{(CR_aF_{2-a}O_b)_t-(CR=CRO_b)_w\}-CH_cF_{3-c}$$

or $$H_2N-(CR^1)[-(CH_2)_s-\{(CR_aF_{2-a}O_b)_t-(CR=CRO_b)_w\}-CH_cF_{3-c}]_2$$

where a, b, c, s, t, and w are the same or different at each occurrence and are integers, and
 a=0-2,
 b=0-1,
 c=0-3,
 R=H or $(CH_aF_{2-a})_pF$,
 $R^1$, $R^2$=H or $C_pH_{2p+1}$,
 p=1-3,
 s=0-5,
 t=2-15, and
 w=0-2.

The groups within the brackets { } can be arranged in any order. In some embodiments, $1 \leq s < 4$. In some embodiments, s=2 or 3. In some embodiments, $4 \leq t+w \leq 12$. In some embodiments, c=0. In some embodiments, w=0 or 1. In some embodiments, a=0. In some embodiments, R=H or $CF_3$. In some embodiments, $R^1=R^2=H$. In some embodiments, $R^1=R^2=CH_3$.

Some non-limiting examples of amines include:

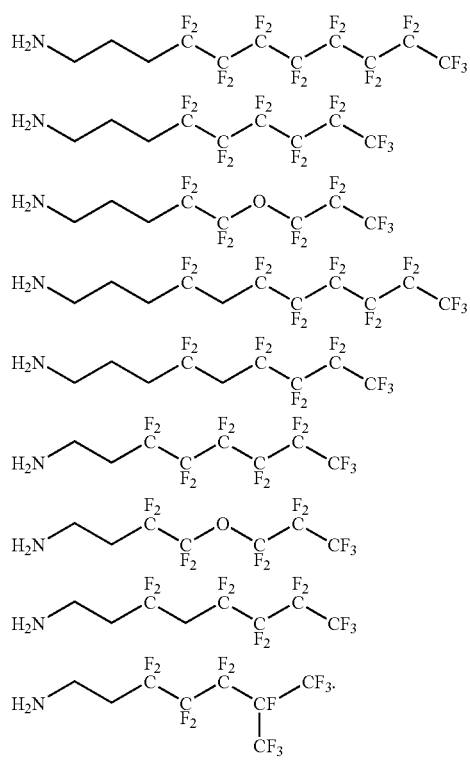

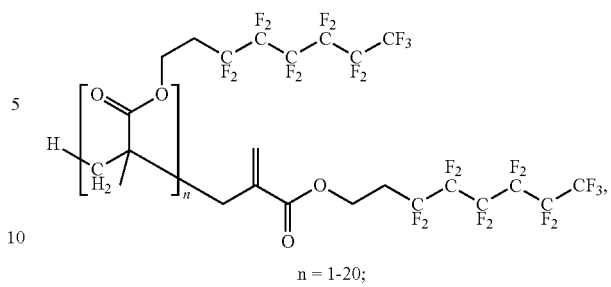

n = 1-20;

and combinations thereof.

In general, PCSA materials can be made using techniques which are known in organic chemistry.

Physical differentiation between areas of the PCSA exposed to radiation and areas not exposed to radiation, hereinafter referred to as "development," can be accomplished by any known technique. Such techniques have been used extensively in the photoresist art. Examples of development techniques include, but are not limited to, application of heat (evaporation), treatment with a liquid medium (washing), treatment with an absorbant material (blotting), treatment with a tacky material, and the like. In the development step, the PCSA is removed in the unexposed areas.

4. The Organic Device Layer

The organic device layer includes a charge-selective material, a radiation sensitizer, and a photocurable surface-active composition.

In a particular embodiment, the charge-selective material comprises hole-transport material.

Commonly used small molecule hole-transporting materials include, but are not limited to: 4,4',4"-tris(N,N-diphenyl-amino)-triphenylamine (TDATA); 4,4',4"-tris(N-3-methylphenyl-N-phenyl-amino)-triphenylamine (MTDATA); N,N'-diphenyl-N,N'-bis(3-methylphenyl)-[1,1'-biphenyl]-4,4'-diamine (TPD); 1,1-bis[(di-4-tolylamino)phenyl]cyclohexane (TAPC); N,N'-bis(4-methylphenyl)-N,N'-bis(4-ethylphenyl)-[1,1'-(3,3'-dimethyl)biphenyl]-4,4'-diamine (ETPD); tetrakis-(3-methylphenyl)-N,N,N',N'-2,5-phenylenediamine (PDA); α-phenyl-4-N,N-diphenylaminostyrene (TPS); p-(diethylamino)benzaldehyde diphenylhydrazone (DEH); triphenylamine (TPA); bis[4-(N,N-diethylamino)-2-methylphenyl](4-methylphenyl)methane (MPMP); 1-phenyl-3-[p-(diethylamino)styryl]-5-[p-(diethylamino)phenyl]pyrazoline (PPR or DEASP); 1,2-trans-bis (9H-carbazol-9-yl)cyclobutane (DCZB); N,N,N',N'-tetrakis (4-methylphenyl)-(1,1'-biphenyl)-4,4'-diamine (TTB); N,N'-bis(naphthalen-1-yl)-N,N'-bis-(phenyl)benzidine (α-NPB); and porphyrinic compounds, such as copper phthalocyanine.

Commonly used large molecule hole-transporting materials are polymers, such as polyvinylcarbazole, (phenylmethyl)-polysilane, and polyaniline. In some cases, triarylamine polymers are used, especially triarylamine-fluorene copolymers. In some cases, the polymers and copolymers are crosslinkable.

In some embodiments, the hole-transport polymer is a distyrylaryl compound. In some embodiments, the aryl group is has two or more fused aromatic rings. In some embodiments, the aryl group is an acene. The term "acene" as used herein refers to a hydrocarbon parent component that contains two or more ortho-fused benzene rings in a straight linear arrangement.

Additional examples of fluorinated alcohols and amines can be found in, for example, J. Fluorine Chemistry 77 (1996) 193-194; J. Fluorine Chemistry 80 (1996) 135-144; and U.S. Pat. Nos. 6,479,612 and 7,138,551.

When the PCSA is an ester, all of the acid groups of the α,β-unsaturated polyacid are esterified and at least one acid group is esterified with a fluoroalkyl group. In some embodiments, all of the acid groups of the α,β-unsaturated polyacid are esterified with fluoroalkyl groups.

When the PCSA is an imide, all of the acid groups of the α,β-unsaturated polyacid are imidized and at least two of the acid groups are imidized with a fluoroalkyl group. In some embodiments, all of the acid groups of the α,β-unsaturated polyacid are imidized with fluoroalkyl groups.

The PCSA may further comprise fluorinated esters or imides of an α,β-unsaturated polyacids in combination with fluorinated esters or fluorinated imides or amides of α,β-unsaturated monoacids. These esters, amides and imides can be made from the alcohols and amines described above. Examples of α,β-unsaturated monoacids include, but are not limited to acrylic acid, methacrylic acid, α-hydroxymethacrylic acid and α-chloromethacrylic acid.

The PCSA may further comprise adjuvants including stabilizers, flow-enhancers, plasticizers, photoinitiators, photoradical generators and other components designed to enhance the processes described herein. In some embodiments, the PCSA is selected from the group consisting of bis(3,3,4,4,5,5,6,6,7,7,8,8,8-tridecafluorooctyl)fumarate; bis(3,3,4,4,5,5,6,6,7,7,8,8,8-tridecafluorooctyl)maleate; bis(3,3,4,4,6,6,7,7,8,8,8-undecafluoro-5-oxa-octyl)maleate; bis(3,3,5,5,6,6,7,7,8,8,8-undecafluorooctyl)maleate; 4,4,5,5,6,6,7,7,8,8,9,9,10,10,11,11,11-heptadecafluoroundecyl maleimide; bis(3,3,4,4,5,5,6,6,7,7,8,8,8-tridecafluorooctyl)itaconate; bis(3,3,4,4,5,5,6,6,7,7,8,8,8-tridecafluorooctyl)-cis,cis-muconate;

In some embodiments, the hole-transport polymer is an arylamine polymer. In some embodiments, it is a copolymer of fluorene and arylamine monomers.

In some embodiments, the polymer has crosslinkable groups. In some embodiments, crosslinking can be accomplished by a heat treatment and/or exposure to UV or visible radiation. Examples of crosslinkable groups include, but are not limited to vinyl, acrylate, perfluorovinylether, 1-benzo-3, 4-cyclobutane, siloxane, and methyl esters. Crosslinkable polymers can have advantages in the fabrication of solution-process OLEDs. The application of a soluble polymeric material to form a layer which can be converted into an insoluble film subsequent to deposition, can allow for the fabrication of multilayer solution-processed OLED devices free of layer dissolution problems.

Examples of crosslinkable polymers can be found in, for example, published US patent application 2005-0184287 and published PCT application WO 2005/052027.

In some embodiments, the hole-transport layer comprises a polymer which is a copolymer of 9,9-dialkylfluorene and triphenylamine. In some embodiments, the polymer is a copolymer of 9,9-dialkylfluorene and 4,4'-bis(diphenylamino)biphenyl. In some embodiments, the polymer is a copolymer of 9,9-dialkylfluorene and TPB. In some embodiments, the polymer is a copolymer of 9,9-dialkylfluorene and NPB. In some embodiments, the copolymer is made from a third comonomer selected from (vinylphenyl)diphenylamine and 9,9-distyrylfluorene or 9,9-di(vinylbenzyl)fluorene.

The polymers for the hole-transport layer can generally be prepared by known synthetic routes, including Yamamoto and Suzuki coupling.

5. Fabrication of an Electronic Device

One example of an electronic device is an organic light-emitting diode ("OLED"). Such devices have a light-emitting layer positioned between two electrodes, and can have one or more charge-selective layers between the light-emitting layer and either electrode. The charge-selective layers can comprises charge-injecting, charge-transporting and/or charge-blocking materials, and are generally electrically conductive. When these materials are present in regions outside the active pixel areas, they can carry undesired currents, detracting from the electrical efficiency of the pixel. In addition, if any emissive materials are present outside the pixel area, a secondary emissive diode can be formed and contribute undesired color to the display. Furthermore, the charge-selective layers may contribute to undesirable cross-talk from pixel to pixel. The process described herein can be used to decrease the electrical conductivity of at least one of the charge-selective layers so that these problems are significantly reduced or eliminated.

In addition, the surface energy differences between the exposed and unexposed areas of the organic device layer, after development provide a chemical containment pattern for forming subsequent layers.

In a particular embodiment, the unexposed areas of the organic device layer are in the pixel areas of a device and are surrounded by exposed areas. The surrounding exposed areas have higher resistivity. This prevents cross-talk from one pixel to another. It further prevents the formation of a secondary diode with materials outside the pixel area. For example, electron transport materials such as tris(8-hydroxyquinoline)aluminum and tetrakis(8-hydroxyquinoline)zirconium, which are frequently present outside the pixel area, can also be emissive. The surrounding exposed areas also have lower surface energy than in the pixel areas. Thus, when the organic active materials are applied they are contained in the pixel areas and do not spread to form mixed colors.

Figure 2:
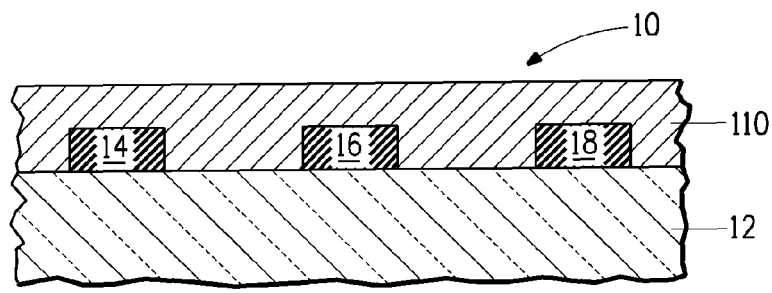
FIG. 2 includes an illustration of a cross-sectional view of a workpiece including a substrate, electrodes, and a charge-selective layer.

FIG. 2 includes an illustration of a cross-sectional view of a workpiece 10 including a substrate 12. In the illustrated embodiment, the workpiece 10 includes electrodes 14, 16, and 18, and an organic device layer 110.

The substrate 12 can be either rigid or flexible and may include one or more layers of one or more materials such as glass, polymer, metal or ceramic materials, or combinations thereof. In one embodiment, the substrate 12 is substantially transparent to a targeted wavelength or spectrum of wavelengths associated with the electronic device. Pixel control or other circuits (not illustrated) can be formed within or over the substrate 12 using conventional or proprietary techniques.

In the illustrated embodiment, the electrodes 14, 16, and 18 serve as electrodes for electronic components, such as OLEDs. In one embodiments, the electrodes 14, 16, and 18 are anodes and have a work function of approximately 4.4 eV or higher. In a particular embodiment, the electrodes 14, 16, and 18 can include InSnO, InZnO, AlZnO, AlSnO, ZrSnO, another suitable material used for an anode in an OLED, or any combination thereof. The electrodes 14, 16, and 18 have a thickness in a range of approximately 10 to 1000 nm. The electrodes 14, 16, and 18 are formed by a deposition using a conventional or proprietary technique. The electrodes 14, 16, and 18 may include the same material or different materials, have the same or different thicknesses, be formed using the same or different technique, be formed at the same or different time, or any combination thereof.

Although not illustrated, a structure (e.g., a well structure, cathode separators, or the like) may lie adjacent to the electrode 14, 16, 18, or any combination thereof to reduce the likelihood of materials from different organic active layers from contacting each other at locations above the electrode 14, 16, 18, or any combination thereof.

The organic device layer 110, as discussed above, is formed over the electrodes 14, 16, and 18. The organic device layer 110 has a thickness in a range of approximately 50 to 500 nm, and in another embodiment, can be thicker or thinner than the recited range. Any individual or combination of films within the organic device layer 110 can be formed by a conventional or proprietary deposition technique and may be cured after deposition. In one embodiment, the organic device layer 110 is formed by a liquid deposition technique.

Figure 3:
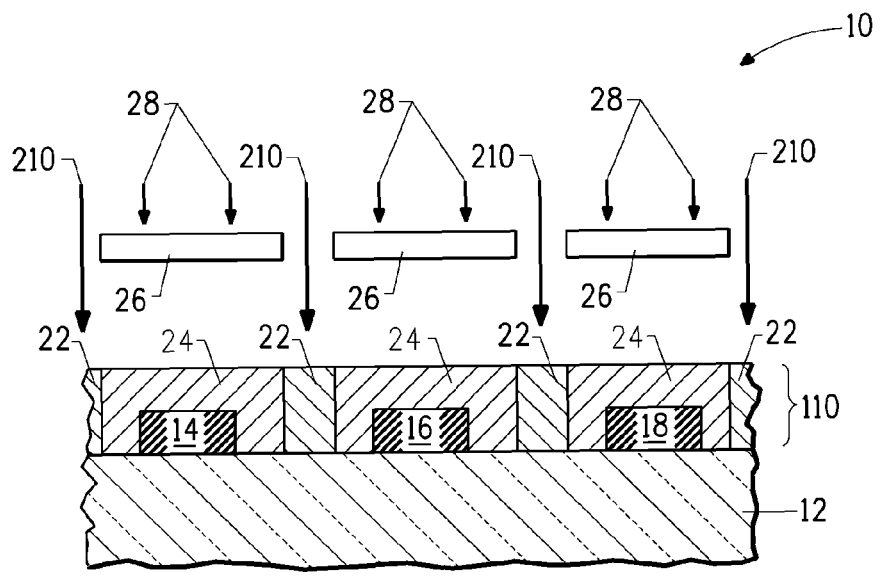
FIG. 3 includes an illustration of a cross-sectional view of the workpiece of FIG. 2 while selectively modifying a portion of the charge-selective layer.

FIG. 3 includes an illustration of the workpiece 10 while selectively modifying the organic device layer 110. In the illustrated embodiment, selectively modifying includes selectively exposing a first portion 22 of the organic device layer 110 to radiation 210. The workpiece 10 is arranged such that a stencil mask 26 lies between a radiation source (not illustrated) and the workpiece 10. Radiation 210 is unattenuated and reaches the first portion 22 of the layer 110. Radiation 28 is attenuated and substantially prevented from reaching a second portion 24 of the organic device layer 110 by the stencil mask 26. In a particular embodiment, wavelength of the radiation 210 has a value not greater than approximately 365 nm. In a more particular embodiment, the radiation 210 includes UV-A radiation, UV-B radiation, UV-C radiation, or any combination thereof. In an even more particular embodiment, the radiation 210 is UV-C radiation with a wavelength in a range of approximately 200 to approximately 280 nm.

In another particular embodiment, the radiation 210 has a peak intensity of at least 1 J/cm$^2$ at the surface of the organic device layer 110. In another embodiment, the radiation 210 can include a particle beam (e.g., an electron beam). In still another embodiment, selectively modifying the organic device layer 110 is performed in an environment with an oxygen-containing material, such as oxygen, water, an alcohol, a glycol, another oxygen-containing organic material, or any combination thereof. In one embodiment, the oxygen-containing material lies within the organic device layer 210 or an immediately adjacent layer.

After selective exposure to radiation, the organic device layer is subjected to a development treatment to remove the PCSA in the unexposed areas. In a particular embodiment, this can be carried out by heating. The heating step can also effect crosslinking of the hole-transport material, when crosslinkable materials are used.

After selective exposure and development of the organic device layer 110, the first portion 22 has a higher resistivity and a lower surface energy than the second portion 24. In a particular embodiment, the first portion 22 has a resistivity at least two orders of magnitude higher than the second portion 24. In a more particular embodiment, a substantially insulating pattern is formed by the first portion 22 within the organic device layer 110. In a particular embodiment, the first portion 22 has a surface energy low enough so that it is not wettable with common organic solvents. In some embodiments, when the first portion 22 is treated with anisole, the contact angle is greater than 60°; in some embodiments, greater than 70°.

Figure 4:
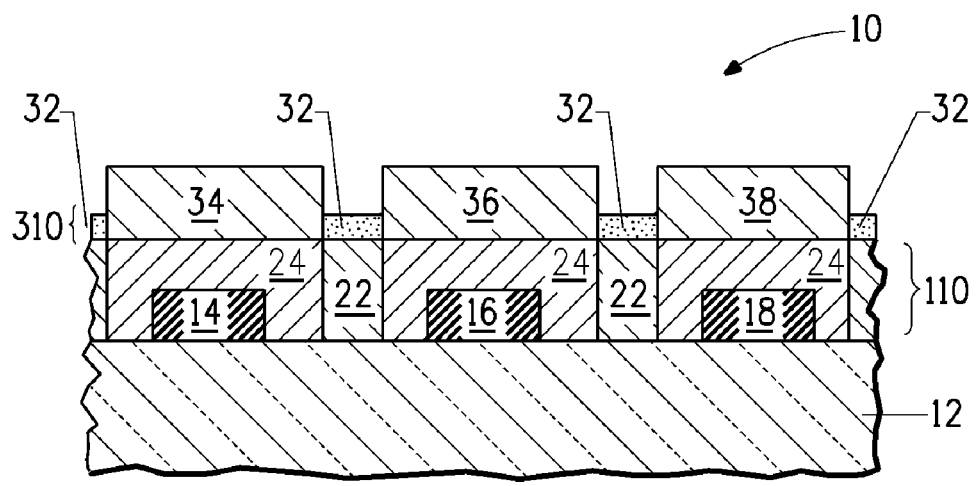
FIG. 4 includes an illustration of a cross-sectional view of the workpiece of FIG. 3 after forming a charge-selective layer and an organic active layer.

FIG. 4 includes an illustration of the workpiece 10 after forming an organic active layer 310. In the illustrated embodiment, the organic active layer 310 includes an organic active layer 34 over the electrode 14, an organic active layer 36 over the electrode 16, and an organic active layer 38 over the electrode 18. The organic active layers are repelled by the low surface energy of portion 22 in areas 32, and thus are contained in the desired areas. Each of the organic active layer 34, the organic active layer 36, and the organic active layer 38 serves as an electroluminescent ("EL") layer in an OLED and emits radiation. In one embodiment, the organic active layer 34, 36, 38, or any combination thereof emits a portion of the visible light spectrum. In another embodiment, the organic active layer 34, 36, 38, or any combination thereof emits a portion of the UV spectrum, the IR spectrum, or any combination thereof. In a more particular embodiment, each of the organic active layers 34, 36, and 38 includes different radiation-emitting materials and emit a significantly different spectrum of light as compared to the other organic active layers of the organic active layer 310. In yet another embodiment, the organic active layer 34, 36, 38, or any combination thereof is used in a radiation-responsive component, such as a radiation sensor, photovoltaic cell, or the like.

The organic active layer 34, 36, 38, or any combination thereof include material(s) conventionally used as organic active layers in organic electronic devices and can include a small molecule material, a large molecule material, or any combination thereof, including small molecule organic fluorescent compounds, fluorescent and phosphorescent metal complexes, conjugated polymers, and mixtures thereof. Examples of fluorescent compounds include, but are not limited to, pyrene, perylene, rubrene, coumarin, derivatives thereof, and mixtures thereof. Examples of metal complexes include, but are not limited to, metal chelated oxinoid compounds, such as tris(8-hydroxyquinolato)aluminum (Alq3); cyclometalated iridium and platinum electroluminescent compounds, such as complexes of iridium with phenylpyridine, phenylquinoline, or phenylpyrimidine ligands as disclosed in Petrov et al., U.S. Pat. No. 6,670,645 and Published PCT Applications WO 03/063555 and WO 2004/016710, and organometallic complexes described in, for example, Published PCT Applications WO 03/008424, WO 03/091688, and WO 03/040257, and mixtures thereof. Electroluminescent emissive layers comprising a charge carrying host material and a metal complex have been described by Thompson et al., in U.S. Pat. No. 6,303,238, and by Burrows and Thompson in published PCT applications WO 00/70655 and WO 01/41512. Examples of conjugated polymers include, but are not limited to poly(phenylenevinylenes), polyfluorenes, poly (spirobifluorenes), polythiophenes, poly(p-phenylenes), copolymers thereof, and mixtures thereof.

The organic active layer 34, 36, 38, or any combination thereof has a thickness in a range of approximately 40 to 100 nm, and in a particular embodiment, a thickness in a range of approximately 70 to 90 nm. In another embodiment, each of the organic active layers 34, 36, and 38 has the same or different thickness as compared to the other organic active layers of the organic active layer 310.

The organic active layer 34, 36, 38, or any combination thereof is deposited using a conventional or proprietary deposition technique. In a more particular embodiment, the deposition technique is a liquid deposition process including a precision deposition process, such as a continuous printing process, an ink-jet printing process, or the like. The organic active layer 34, 36, 38, or any combination thereof is formed using the same or different processes at the same or different time.

Figure 5:
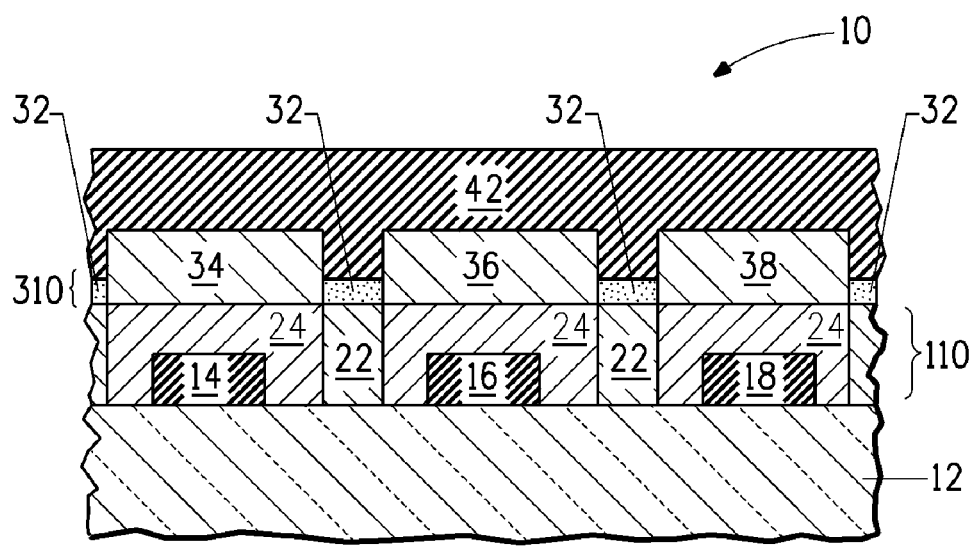
FIG. 5 includes an illustration of a cross-sectional view of the workpiece of FIG. 4 after forming a substantially complete electronic device.

FIG. 5 includes an illustration of a cross-sectional view of a substantially complete electronic device including an electrode 42. In the illustrated embodiment, the electrode 42 serves as a cathode.

The electrode 42 can include a Group 1 metal, a Group 2 metal, a Group 12 metal, or any combination thereof. In a particular embodiment, the electrode 42 includes an element, alloy, salt, or any combination thereof containing a Group 1 element. In a more particular embodiment, the electrode 42 includes a lithium-containing material such as LiF, $Li_2O$, or any combination thereof. The electrode 42 can have a thickness in a range of approximately 20 to 2500 nm. The electrode 42 can be formed by a conventional or proprietary physical deposition technique and may include more than one layer. In one embodiment, the electrode 42 includes at least one layer deposited using a stencil mask.

Thus an electronic device is formed with an organic device layer 110 selectively modified to including a portion 22 with a higher resistivity and a lower surface energy than a portion 24. By using such a process, a conducting pathway is defined and charge-flux can be controlled within the electronic device. In addition, the layer immediately over the organic device layer, exemplified above as the organic active layer 310, can be constrained to the desired areas by without bank structures, by the low surface energy of portion 22 of the organic device layer.

6. Other Device Layers

In some embodiments, a buffer layer is present between the electrode and the hole-transport layer. The term "buffer layer" or "buffer material" refers to electrically conductive or semiconductive materials and may have one or more functions in an organic electronic device, including but not limited to, planarization of the underlying layer, charge transport and/or charge injection properties, scavenging of impurities such as oxygen or metal ions, and other aspects to facilitate or to improve the performance of the organic electronic device. Buffer materials may be polymers, oligomers, or small molecules, and may be in the form of solutions, dispersions, suspensions, emulsions, colloidal mixtures, or other compositions.

The buffer layer is typically formed with polymeric materials, such as polyaniline (PANI) or polyethylenedioxythiophene (PEDOT), which are often doped with protonic acids. The protonic acids can be, for example, poly(styrenesulfonic acid), poly(2-acrylamido-2-methyl-1-propanesulfonic acid), and the like. The buffer layer 120 can comprise charge transfer compounds, and the like, such as copper phthalocyanine and the tetrathiafulvalene-tetracyanoquinodimethane system (TTF-TCNQ). In one embodiment, the buffer layer 120 is made from a dispersion of a conducting polymer and a colloid-forming polymeric acid. Such materials have been described in, for example, published U.S. patent applications 2004-0102577, 2004-0127637, and 2005/0205860.

The buffer layer can be applied by any deposition technique. In one embodiment, the buffer layer is applied by a solution deposition method, as described above. In one embodiment, the buffer layer is applied by a continuous solution deposition method.

In some embodiments, and electron transport/injection layer is present between the organic active layer and the cathode. This layer can function both to facilitate electron injection/transport, and can also serve as a confinement layer to prevent quenching reactions at layer interfaces. More specifically, the layer may promote electron mobility and reduce the likelihood of a quenching reaction if the organic active layer and cathode would otherwise be in direct contact. Examples of materials for this layer include, but are not limited to, metal-chelated oxinoid compounds (e.g., $Alq_3$ or the like); phenanthroline-based compounds (e.g., 2,9-dimethyl-4,7-diphenyl-1,10-phenanthroline ("DDPA"), 4,7-diphenyl-1,10-phenanthroline ("DPA"), or the like); azole compounds (e.g., 2-(4-biphenylyl)-5-(4-t-butylphenyl)-1,3,4-oxadiazole ("PBD" or the like), 3-(4-biphenylyl)-4-phenyl-5-(4-t-butylphenyl)-1,2,4-triazole ("TAZ" or the like); other similar compounds; or any one or more combinations thereof. Alternatively, the layer may be inorganic and comprise BaO, LiF, $Li_2O$, or the like.

In other embodiments, additional layer(s) may be present within organic electronic devices.

The different layers may have any suitable thickness. The inorganic anode layer is usually no greater than approximately 500 nm, for example, approximately 10-200 nm; the buffer layer and hole-transport layer are each usually no greater than approximately 250 nm, for example, approximately 50-200 nm; the organic active layer is usually no greater than approximately 1000 nm, for example, approximately 50-80 nm; the electron transport/injection layer is usually no greater than approximately 100 nm, for example, approximately 20-80 nm; and the cathode layer is usually no greater than approximately 100 nm, for example, approximately 1-50 nm.

The electronic device may be used by itself or may be incorporated into a system. For example, the electronic device can be a display that can be incorporated into a monitor for a computer, a television, or a display in a mobile communicating device, or the like.

The electronic device can be operated by providing the proper signals and data to the terminals as illustrated in FIG. 5. Appropriate voltages can be provided to the electrodes 14, 16, 18, and 42. In one embodiment, having radiation-emitting components, the electrodes 14, 16, and 18 are coupled to a $V_{DD}$ power supply terminal, and the electrode 42 is coupled to a $V_{SS}$ power supply terminal. In another embodiment, having radiation-responsive components (e.g. sensors), the electrode 42 can be placed at a more positive potential with respect to the electrodes 14, 16, and 18. In a particular embodiment, the electrode 42 can be at a potential of approximately 0 volts, and the electrodes 14, 16, and 18 can be at a potential of approximately −10 volts. When other types of electronic devices are formed (e.g., a photovoltaic array), the voltages or other signals may change accordingly.

EXAMPLES

The concepts described herein will be further described in the following examples, which do not limit the scope of the invention described in the claims.

Example 1

This examples illustrates the synthesis of bis-(3,3,4,4,5,5,6,6,7,7,8,8,8-tridecafluorooctyl)maleate ("PCSA-1")

The 1H,1H,2H,2H-perfluoro-1-octanol (Aldrich) (36.2 grams, 99.4 mmole) was placed in a 250 ml flask under nitrogen and treated with maleic anhydride (4.06 grams, 41.4 mmole) followed by p-toluenesulfonic acid monohydrate (0.78 gram, 4.1 mmole). The mixture was stirred and heated under nitrogen to 113-115° C. to give a clear colorless liquid. The mixture was maintained at 113-115° C. for 65 minutes and then it was cooled to room temperature. The reaction mixture was chromatographed on a silica gel column (5 cm diameter and 19 cm long) using 15% ethyl acetate in hexane to give 27.07 grams (81%) of a colorless oil. The oil solidified after standing at room temperature. It was dissolved in a minimum amount (several milliliters) of ethyl acetate. The solution was diluted with approximately 40 ml of hexane to near cloud point. The solution was cooled in an ice bath and then seeded with a previously synthesized sample of the solid product. The resulting crystallized solid was filtered off, washed 3 times with hexane, air dried and then dried under high vacuum to give 18.52 grams (55% final yield) of a white solid. $^1$H NMR ($CDCl_3$): δ (ppm): 6.29 (s, 2H), 4.50 (t, 4H), 2.53 (m, 4H). $^{19}$F NMR ($CDCl_3$): δ (ppm): −81.3 (m, 6F), −114.1 (m, 4F), −122.3 (m, 4F), −123.3 (m, 4F), −124.0 (m, 4F), −126.6 (m, 4F)

Example 2

This example illustrates the process described herein where the resistivity of a hole-transport layer is increased, and the surface energy is decreased.

The hole-transport material is a crosslinkable copolymer of triphenylamine, dioctyl fluorene, and distyryl fluorene ("HT-1").

The radiation sensitizer is Darocur 1173 (Ciba Specialty Chemicals, Basel, Switzerland), which is an acetophenone derivative.

Backlight test displays will be made by coating sample solutions on to indium tin oxide coated glass substrates. Some of the displays will be exposed to UV light. The backlights will be baked at 275 C for 30 minutes to crosslink the HT-1, and simultaneously remove the Darocur 1173, if present. The backlights will be covered with appropriate cathode layers of ZrQ then LiF then Al by vapor deposition, and then encapsulated to exclude air and water vapor. The resulting diodes represent the structure of the leakage paths in an actual display. A voltage will be applied, and the resulting electrical currents through these diodes will be measured. The surface energy of the samples will be determined by contact angle with anisole.

Sample 1 will be made with a solution of 0.3 g of HT-1 in toluene, without UV exposure.

Sample 2 will be made with a solution of 0.3 g of HT-1 in toluene, with UV exposure.

Sample 3 will be made with a solution of 0.3 g of HT-1, 5 wt/vol % Darocur 1173, and 1 wt/vol % PCSA-1, and with UV exposure.

The current measured will be in the relative order:
Sample 1>Sample 2>Sample 3.
The surface energy determined will be in the relative order:
Sample 1≈Sample 2>Sample 3.

Note that not all of the activities described above in the general description or the examples are required, that a portion of a specific activity may not be required, and that one or more further activities may be performed in addition to those described. Still further, the order in which activities are listed are not necessarily the order in which they are performed.

In the foregoing specification, the concepts have been described with reference to specific embodiments. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of invention. For example, although the specification includes a description of a bottom emitting electronic device, after reading this specifications, skilled artisans should be able to form a top emitting electronic device without undue experimentation.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

It is to be appreciated that certain features are, for clarity, described herein in the context of separate embodiments, may also be provided in combination in a single embodiment. Conversely, various features that are, for brevity, described in the context of a single embodiment, may also be provided separately or in any subcombination. The use of numerical values in the various ranges specified herein is stated as approximations as though the minimum and maximum values within the stated ranges were both being preceded by the word "about." In this manner slight variations above and below the stated ranges can be used to achieve substantially the same results as values within the ranges. Also, the disclosure of these ranges is intended as a continuous range including every value between the minimum and maximum average values including fractional values that can result when some of components of one value are mixed with those of different value. Moreover, when broader and narrower ranges are disclosed, it is within the contemplation of this invention to match a minimum value from one range with a maximum value from another range and vice versa.

What is claimed is:

1. A process of forming an electronic device comprising:
   forming an organic device layer comprising a charge-selective material, a radiation sensitizer, and a small molecule photocurable surface-active composition, said layer having a first electrical conductivity and a first surface energy; and
   selectively exposing portions of the organic device layer to radiation resulting in exposed areas and unexposed areas, and
   applying a development treatment,
   wherein the electrical conductivity of the exposed areas of the organic device layer is less than the first electrical conductivity, and the surface energy of the exposed areas of the organic device layer is less than the first surface energy.

2. The process of claim 1, wherein the charge-selective material is hole-transport material.

3. The process of claim 1, wherein the photocurable surface-active composition comprises a material selected from the group consisting of a fluorinated ester of an $\alpha,\beta$-unsaturated polyacid, a fluorinated imide of an $\alpha,\beta$-unsaturated polyacid, and combinations thereof.

4. The process of claim 1, wherein the polyacid is a polycarboxylic acid.

5. The process of claim 4, wherein the polyacid is selected from the group consisting of fumaric acid, maleic acid, itaconic acid, 2,2-dimethyl-4-methylenepentanedioic acid, muconic acid, 2-methyleneglutaric acid, acotinic acid, oligomers of methacrylic acid, and combinations thereof.

6. The process of claim 3, wherein the ester is formed using an alcohol having the formula $R_fOH$, where the carbon atom chain of the $R_f$ group has 4-15 carbon atoms, 0-5 oxo oxygen atoms contained within the carbon atom chain, and at least 4 fluorine atoms attached to the carbon atoms of the carbon atom chain, with the proviso that there is no fluorine atom on the carbon atom bearing OH.

7. The process of claim 3, wherein the imide is formed using an amine having the formula $R_fNH_2$, where the carbon atom chain of the $R_f$ group has 4-15 carbon atoms, 0-5 oxo oxygen atoms contained within the carbon atom chain, and at least 4 fluorine atoms attached to the carbon atoms of the carbon atom chain, with the proviso that there is no fluorine atom on the carbon atom bearing $NH_2$.

8. The process of claim 1, wherein the development treatment comprises heating to a temperature above room temperature.

9. The process of claim 4, wherein the temperature is in the range of 50° C. to 200° C.

10. The process of claim 1, wherein the radiation sensitizer is a UV sensitizer and selectively modifying the organic device layer comprises selectively exposing the organic device layer to a wavelength of radiation having a value not greater than 365 nm.

11. The process of claim 1, wherein selectively modifying the organic device layer is performed at a peak intensity of at least 1 J/cm² at a surface within the first portion of the organic device layer.

12. The process of claim 1, wherein the exposing to radiation is carried out in air.

* * * * *